(12) United States Patent
Zu et al.

(10) Patent No.: US 6,303,871 B1
(45) Date of Patent: Oct. 16, 2001

(54) DEGASSING HOLE DESIGN FOR OLGA TRACE IMPEDANCE

(75) Inventors: Longqiang Zu, Phoenix; Huong Do, Scottsdale, both of AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/330,648

(22) Filed: Jun. 11, 1999

(51) Int. Cl.[7] .................................................. H05K 7/02
(52) U.S. Cl. .................... 174/250; 174/257; 174/261; 174/262; 428/209; 428/901; 361/748; 361/777; 361/780; 361/783; 361/805; 333/33
(58) Field of Search ....................... 361/748, 777, 361/778, 780, 792, 794, 795, 805, 818; 174/250, 253, 255, 261, 262, 266, 256, 257; 333/12, 33, 246, 247; 257/667, 723, 724; 428/209, 901

(56) References Cited

U.S. PATENT DOCUMENTS

| | | | |
|---|---|---|---|
| 4,859,806 | * | 8/1989 | Smith .................................. 174/261 |
| 5,360,949 | * | 11/1994 | Duxbury ............................. 174/250 |
| 5,410,107 | * | 4/1995 | Schaper .............................. 174/255 |
| 5,519,176 | * | 5/1996 | Goodman et al. ................. 174/255 |
| 5,841,075 | * | 11/1998 | Hanson ............................... 174/250 |
| 6,184,477 | * | 2/2001 | Tanahashi ........................... 174/261 |

\* cited by examiner

*Primary Examiner*—Albert W. Paladini
*Assistant Examiner*—John B. Vigushin
(74) *Attorney, Agent, or Firm*—Schwegman, Lundberg, Woessner & Kluth, P.A.

(57) ABSTRACT

An organic land grid array having multiple built up layers of metal sandwiching non-conductive layers, having a staggered pattern of degassing holes in the metal layers. The staggered pattern occurs in two substantially perpendicular directions. Traces between the metal layers have reduced impedance variation due to the degassing hole pattern.

30 Claims, 3 Drawing Sheets

DEGASSING HOLE DESIGN FOR OLGA TRACE IMPEDANCE

FIELD

The present invention relates generally to computer board and chip packaging, and more specifically to organic land grid array (OLGA) design and manufacturing.

BACKGROUND

As input/output (I/O) speed and the total number of I/Os required for high performance semiconductor chips have increased dramatically, the need for increased numbers of interconnect lines with low line impedance variation in chip packages has increased as well. To address this need, manufacturers have used multi-layered packages where several layers of conductors are separated by layers of dielectric material.

In printed circuit board (PCB) and integrated circuit (IC) manufacture, often silicon dies are to be connected to a mother board. This connection of a die to a mother board is known as a package. The die may be flip mounted to a piece of substrate called an Organic Land Grid Array (OLGA). The OLGA is typically formed of a core of FR4 material used commonly in the manufacture of printed circuit boards.

On two sides of the OLGA board are typically a series of built-up layers, formed from alternating layers of dielectric material and conductive material. Patterns may be built in the metal or conductive layer through various etching processes such as wet etching which are known in the art and will not be described further herein. Plated through holes called vias are used to make interconnects between various layers of metal. Using these layers and vias, several layers of interconnections may be built up.

In an OLGA packaging technology, input/output functions are accomplished using metal traces between the layers. These traces are typically grouped. Each trace has an impedance generated by its geometry and location on the OLGA. Due to the manufacturing technology and material requirements, OLGA packages require a number of degassing holes to be formed in the metal layers to allow for proper operation. Degassing holes allow gas to be evaporated so that bubbles do not form in the package.

Traces may be routed over or under the degassing holes, or around the degassing holes, or a combination thereof. Since the traces are not in the same location on the OLGA, the traces have an impedance variation, or mismatch. OLGA trace impedance variation arises from two separate origins, manufacture variation and design variation. Manufacture variation and design variation add statistically to yield overall impedance variation, or mismatch.

Manufacture variation arises from geometry variations of traces, including trace width, trace thickness, dielectric thickness, and variation of the dielectric constant of a dielectric. Design variation is introduced from package design. When traces are run in an OLGA, they have a routing direction and a fan-out direction. Traces must be routed from the die to the package. When the traces are routed, the direction of the trace is referred to as the routing direction. The fan-out direction is typically 45 degrees from the routing direction, either plus 45 degrees or minus 45 degrees.

A typical degassing hole pattern has a grid-like array of degassing holes aligned vertically between two layers, as is shown in FIG. 1. In FIG. 1, the degassing holes 102 of the top and bottom layers are exactly aligned in the x and y directions. When traces such as trace 1 and trace 2 are used with a degassing hole alignment scheme as shown in FIG. 1, trace 1 has less metal from the conductive layers both above and below the trace than trace 2. The difference in the amount of metal above and below traces 1 and 2 continues when the traces are run in the fan-out direction. The degassing hole pattern of FIG. 1 leads to design impedance variations alone being on the order of 20%.

Another degassing hole pattern shown in FIG. 2 has another grid-like array of degassing holes 202 staggered from the degassing holes 204 of the next layer. In FIG. 2, the degassing holes are staggered in the x direction between layers. The distance between degassing holes is known as pitch. The degassing holes of the layers in FIG. 2 are staggered by a half pitch in the x direction. When traces such as trace 3 and trace 4 are used with a degassing hole alignment scheme as shown in FIG. 2, trace 3 has less metal from the conductive layers both above and below the trace than trace 4. The variation in the amount of metal above and below the traces is lowered in fan-out at a 45 degree angle from the x direction because of the staggering of the holes. Still, significant design impedance variations are present with the degassing hole pattern of FIG. 2.

For the reasons stated above, and for other reasons stated below which will become apparent to those skilled in the art upon reading and understanding the present specification, there is a need in the art for a degassing hole pattern that reduces design variation in an OLGA package.

SUMMARY

An OLGA package includes a pair of conductive layers, each layer having a number of degassing apertures therethrough, the apertures of the layers being staggered in both a first direction and a second direction, a non-conductive layer located between conductive layers, and a pair of metal traces between the pair of conductive layers, the traces having approximately the same impedance.

DESCRIPTION OF EMBODIMENTS

In the following detailed description of the embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

Figure 1:
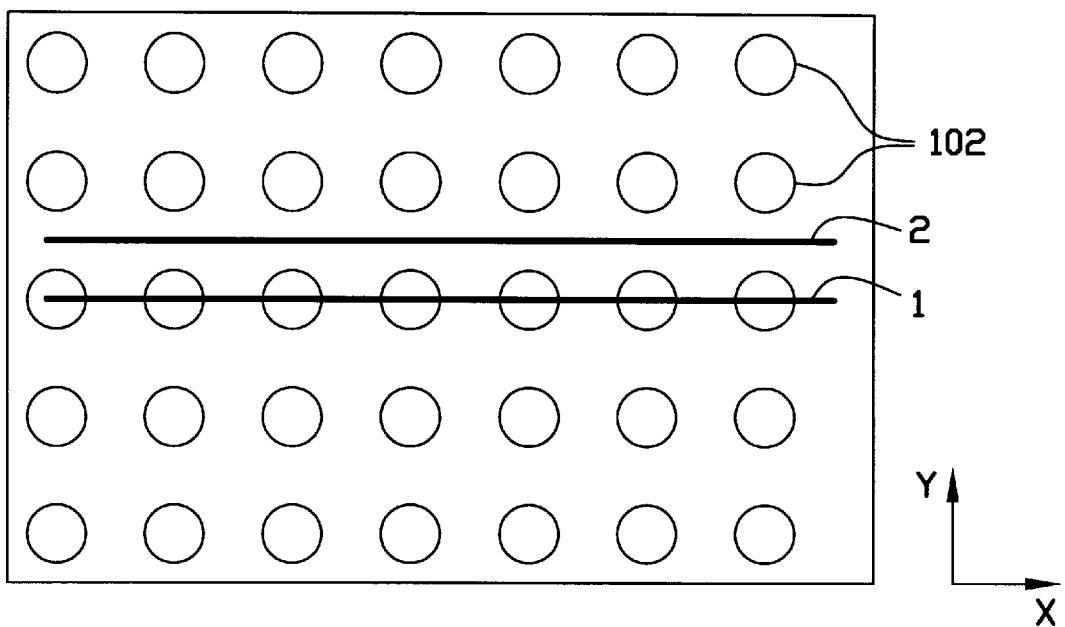
FIG. 1 is a top view of a prior art degassing hole configuration.
Figure 2:
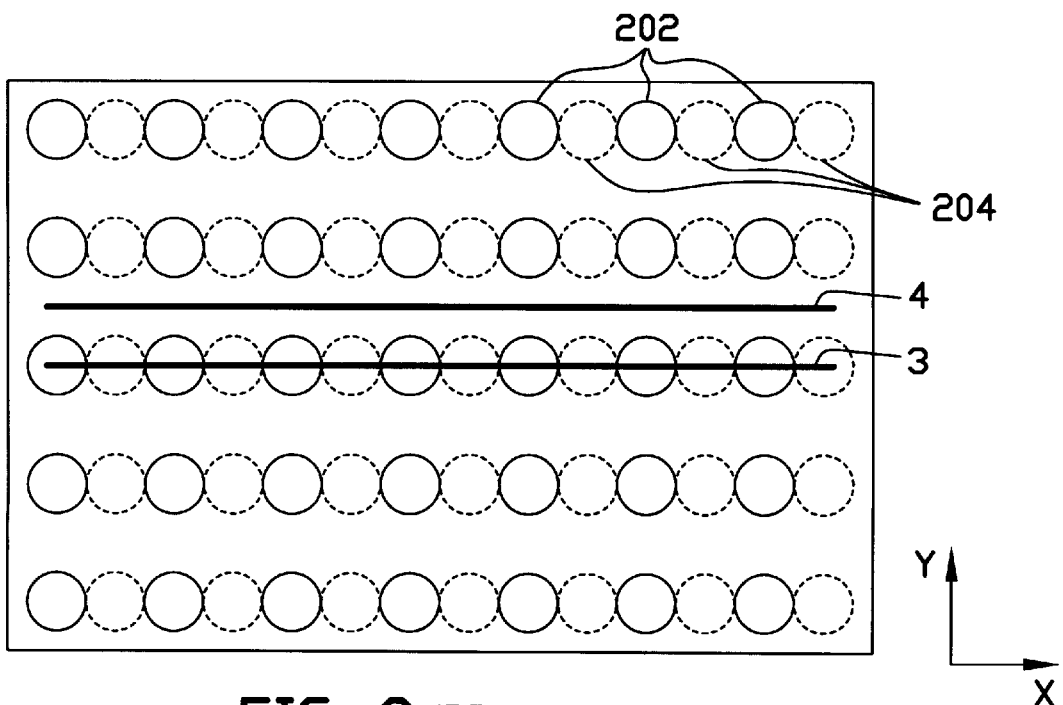
FIG. 2 is a top view of another prior art degassing hole configuration.
Figure 3:
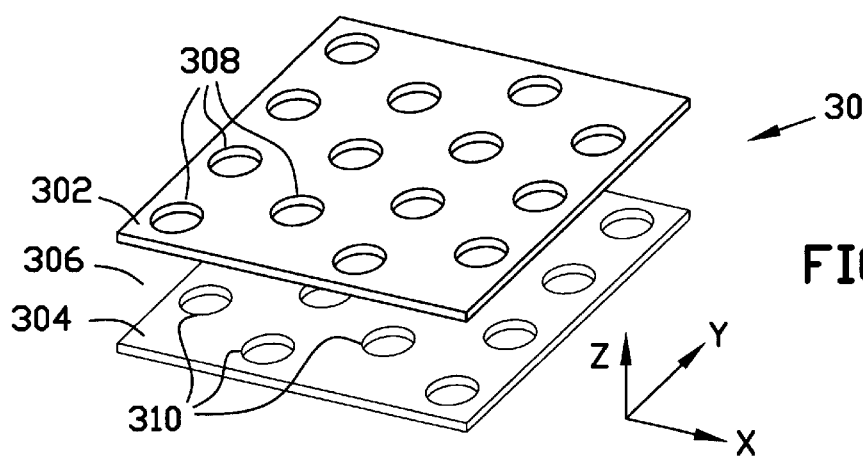
FIG. 3 is an isometric view of a degassing hole configuration according to one embodiment of the invention.

FIG. 3 shows a degassing hole configuration according to one embodiment 300 of the present invention. Embodiment 300 comprises an OLGA having at least two built up layers of metal 302 and 304 sandwiching a dielectric layer 306 (FIG. 3B). Each of the metal layers 302 and 304 has therein a plurality of degassing apertures or holes 308 and 310, respectively. When the metal layers 302 and 304 are aligned vertically, such that the layers are stacked, embodiment 300 has degassing holes 308 in layer 302 and degassing holes 310 in layer 304 which are staggered in both the x direction and the y direction, as referenced in FIG. 3. While x and y are chosen, any coordinate system may be used without departing from the scope of the invention.

Figure 3A:
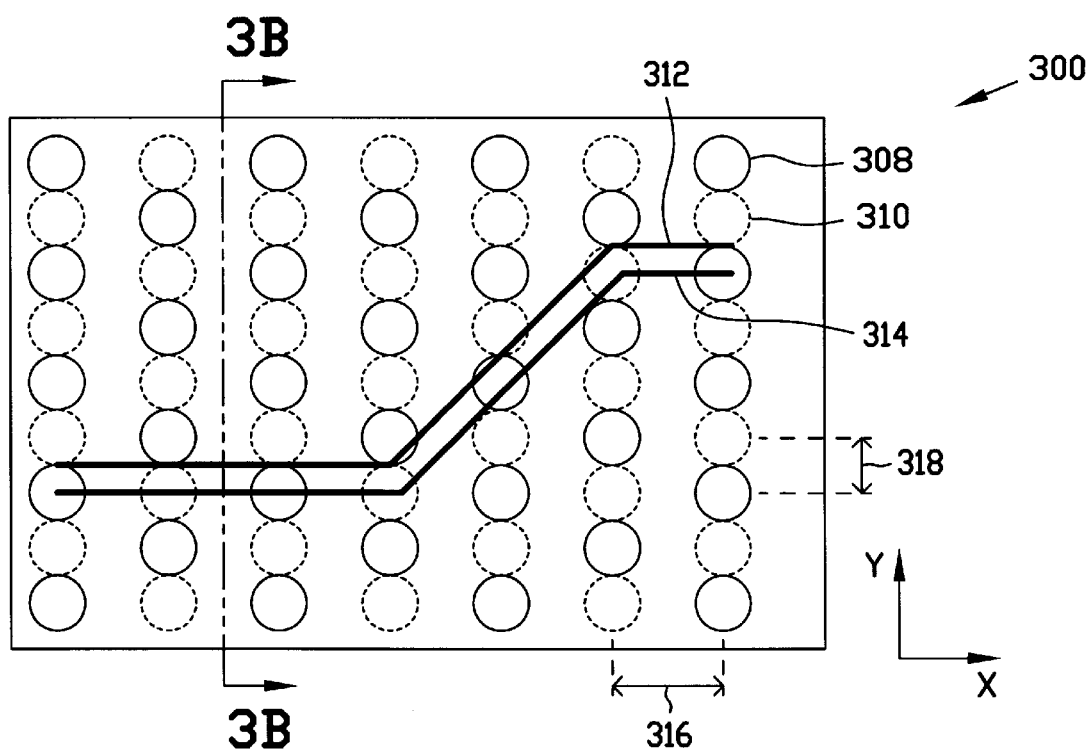
FIG. 3A is a top view of the embodiment shown in FIG. 3.
Figure 3B:
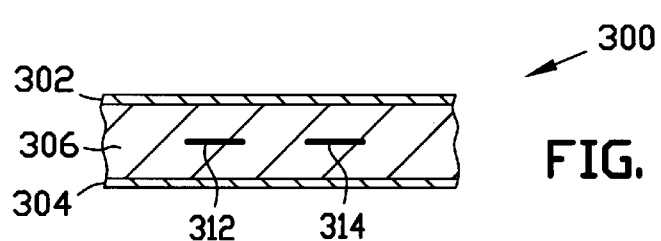
FIG. 3B is a section view of the embodiment shown in FIG. 3A, taken along lines 3B—3B thereof.

In one embodiment, shown also in FIG. 3A, the degassing holes are arranged in a lattice pattern, with the degassing holes in layers 302 and 304 forming a lattice pattern having a lattice constant in one direction, and a second lattice constant in another, substantially perpendicular, direction. For purposes of description, the lattice pattern is shown in FIG. 3 with a first lattice constant in the x direction, and a second lattice constant in the y direction. In this embodiment, the degassing hole lattice pattern has degassing holes alternating from the layer 302 to layer 304 in both the x direction and the y direction. In other words, in the degassing hole lattice pattern as viewed from above, that is looking down on the stacked layers 302 and 304, has degassing holes 308 of layer 302 alternating with degassing holes 304 of layer 310 in both the x direction and the y direction.

Each degassing hole 308 or 310 has a position in x and y coordinates, as well as a z coordinate position. The z direction is best shown in FIG. 3. The z coordinate of all degassing holes on each layer is the same. The z coordinate of all degassing holes 308 on layer 302 is different from that of degassing holes 310 on layer 304, but the same for all degassing holes 308 on layer 302. As may be seen from FIG. 3A, in embodiment 300, each degassing hole is adjacent in the x direction and in the y direction to a degassing hole on a different layer and having a different z coordinate. The degassing holes alternate z coordinates from layer 302 to layer 304 in both the x direction and the y direction. Each degassing hole in embodiment 300 has a unique set of x, y, and z coordinates.

In one embodiment, the first lattice constant, that is the lattice constant in the x direction, has a pitch, or spacing 316, of twice the diameter of the degassing holes 308 and 310. In this embodiment, the second lattice constant, in the y direction, has a pitch 318 equal to the diameter of the degassing holes 308 and 310. In another embodiment, the first lattice constant is 500 microns, and the second lattice constant is 250 microns. In this embodiment, the diameter of the degassing holes is 250 microns. Therefore, the minimum spacing between adjacent degassing holes in either of the layers 302 or 304 is about 500 microns.

Traces, as has been mentioned, are typically grouped. Traces 312 and 314 are shown in FIGS. 3 and 3B. It should be understood, however, that more than two traces may be grouped, and that such additional traces are within the scope of the invention. Each trace may run in a first, routing direction, and may be fanned out in a second, fan-out direction. Typically, the fan-out is accomplished at an angle of plus or minus 45 degrees from the routing direction. As has been mentioned above, different traces having different amounts of metal from the layers above and below the traces will have an impedance mismatch. With the staggered pitch configuration of degassing holes shown in the embodiment of FIG. 3, a signal trace such as trace 312 or 314 routed between the metal layers 302 and 304 will have roughly the same number of degassing holes from each layer in its trace path. Further, each signal trace, such as trace 312 or 314, will also have an amount of metal above and below the trace that is more closely matched with the amount of metal above and below another trace routed in the same fashion.

In the trace configuration shown in FIG. 3, trace 312 and trace 314 are positioned to run in the worst possible trace lines, that is, to create a trace line pair having the largest impedance variation between the traces. As can be seen from the figure, trace 314 crosses the centers of degassing holes in each layer at approximately their centers when running in the routing direction. Trace 312, on the other hand, crosses the edges of the degassing holes in each layer while running in the routing direction. In this worst case scenario, impedance variation due to design considerations may be significantly reduced over impedance variation due to design in different degassing hole configurations.

Provided that the main routing direction for traces in the configuration of FIG. 3 is substantially in the x direction, a trace routed in the x direction will have no restrictions as to its y coordinate. In other words, a trace routed in the x direction could freely be moved up or down in terms of its y coordinate position. If multi-signal lines are routed closely along the x direction, the degassing hole configuration will reduce the amount of wasted space.

The reductions in impedance due to design variations of the embodiment shown in FIG. 3 are even more pronounced in the fan-out direction, 45 degrees from the routing direction. This may be seen in FIG. 3A. When traces are routed in the x direction and fan-out at 45 degrees from the x direction, the traces cross degassing holes both above and below the traces. No matter where the trace runs, if it is approximately 45 degrees, either positive or negative, from the routing direction, it will cross degassing holes. As can be seen from the Figure, each trace 312 and 314 crosses degassing holes in approximately the same number, and covering approximately the same degassing hole area. In other words, each trace 312 and 314 has much less of a variation of the amount of metal above and below the trace when running in the fan-out direction. This further reduces impedance due to design considerations.

Worst case impedance variation due to design factors is significantly reduced by the degassing hole configuration shown in embodiment 300. The elimination of large variations in the amount of metal above and below traces reduces the impedance due to design factors. Traces may be routed with fewer concerns for exacting placement due to the degassing hole configuration of embodiment 300.

Figure 4:
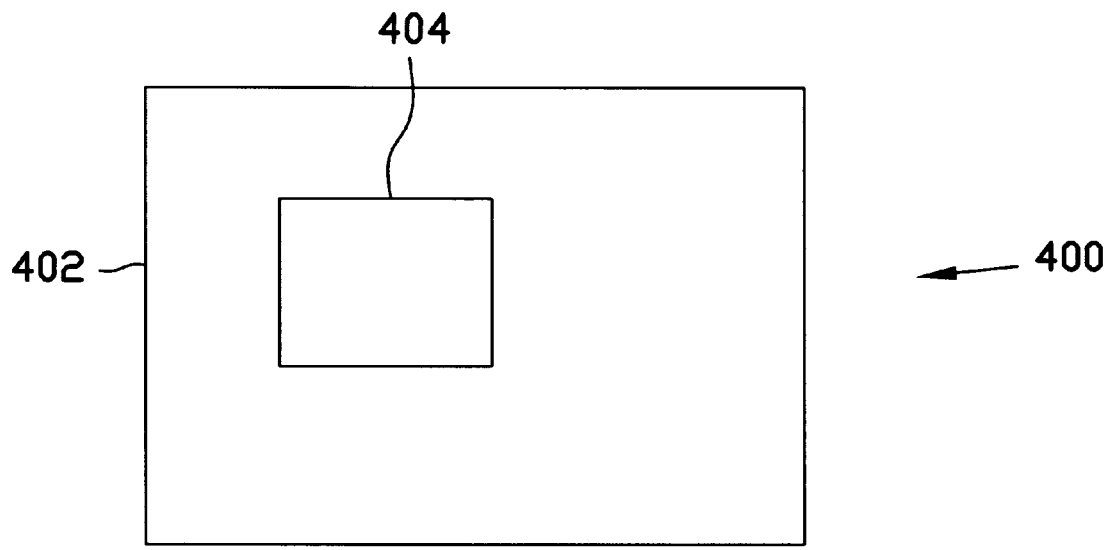
FIG. 4 is a block diagram of an integrated circuit according to one embodiment of the present invention.

FIG. 4 illustrates a block diagram of an integrated circuit 400 of the present invention. The integrated circuit 400 receives an input or control signal. The signal can be coupled to an OLGA package 402 for processing by internal circuitry 404. The OLGA 402 can be arranged as described above with respect to FIG. 3. The integrated circuit may be any type of integrated circuit, including but not limited to a processor, memory, memory controller, or application-specific integrated circuit (ASIC).

Figure 5:
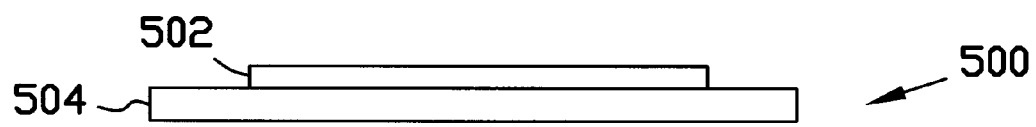
FIG. 5 is a perspective view of a package embodiment of the present invention.

FIG. 5 shows a circuit package embodiment 500 of the present invention. In embodiment 500, a connection of a silicon die 502 is made to an OLGA portion of a motherboard 504. In one embodiment, the silicon die is flip mounted to the board. The OLGA can be arranged as described above with respect to FIG. 3. Also, in another embodiment, an OLGA as described above with respect to FIG. 3 could be mounted to a socket on a motherboard. Such a circuit package could also include a processor or other electronic components known to those of ordinary skill in the art.

In other embodiments, the OLGA package of the present invention could be used in such configurations as for chipset and processor packaging, and the like. Any processor product using OLGA packaging technology is capable of implementing one of the embodiments of the present invention.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. An organic land grid array (OLGA) package, comprising:
   a pair of conductive layers, each layer having a plurality of degassing apertures therethrough, the apertures of the layers offset from one layer to the other layer in both a first direction and a second direction;
   a non-conductive layer located between the pair of conductive layers; and
   at least two metal traces between the pair of conductive layers, the traces having approximately the same impedance.

2. The OLGA package of claim 1, wherein the second direction is substantially perpendicular to the first direction.

3. The OLGA package of claim 1, wherein the first direction is a routing direction.

4. The OLGA package of claim 1, wherein the second direction is a fan-out direction.

5. The OLGA package of claim 1, wherein the apertures of one layer alternate with apertures of the other layer in the first direction.

6. The OLGA package of claim 1, wherein the apertures of one layer alternate with apertures of the other layer in the second direction.

7. The OLGA package of claim 1, and further comprising at least another non-conductive layer and conductive layer built up on the pair of conductive layers, and at least another group of metal traces between the at least another conductive layer and the pair of conductive layers.

8. A substrate, comprising:
   a first layer and a second layer stacked substantially on top of one another, and having a third layer sandwiched therebetween, each of the first and second layers having a plurality of apertures therein, the aperture positions in the first layer alternating in a first direction with the aperture positions in the second layer, and the aperture positions in the first layer alternating in a second direction substantially perpendicular to the first direction with the aperture positions in the second layer; and
   at least two metal traces between the first and the second layers, the traces running generally in the first direction.

9. The substrate of claim 8, wherein the traces fan out at a first angle to the first direction.

10. The substrate of claim 9, wherein the first angle is plus or minus approximately 45 degrees.

11. The substrate of claim 8, wherein the apertures are degassing holes.

12. The substrate of claim 8, wherein the apertures of the first layer and the second layer are arranged in a lattice formation.

13. The substrate of claim 8, wherein the first direction is a routing direction and wherein the spacing between adjacent apertures in the routing direction is twice the spacing between adjacent apertures in the second, substantially perpendicular direction.

14. The substrate of claim 8, wherein the spacing between apertures in the first layer is 1000 microns in the first direction and wherein the spacing between apertures in the first layer is 500 microns in the second direction.

15. The substrate of claim 8, wherein the spacing between apertures in the second layer is 1000 microns in the first direction.

16. The substrate of claim 8, wherein the spacing between apertures in the second layer is 500 microns in the second direction.

17. The substrate of claim 8, wherein the spacing between apertures of the first layer and the second layer in the first direction is 500 microns.

18. The substrate of claim 8, wherein the spacing between apertures of the first and the second layer in the second direction is 250 microns.

19. In an organic substrate having at least two built-up layers, a top layer and a bottom layer, sandwiching a third layer therebetween, the top layer and the bottom layer having a degassing hole configuration comprising a plurality of degassing holes in each of the top layer and the bottom layer, wherein the degassing holes form a lattice having degassing holes alternating between the top layer and the bottom layer, the holes being staggered in pitch between the top layer and the bottom layer, the holes staggered in a first, routing direction, and in a second direction substantially perpendicular to the first direction.

20. An integrated circuit package, comprising,
   a silicon die;
   an organic land grid array (OLGA) mounted to the silicon die, the OLGA comprising:
      a top layer and a bottom layer, each of the layers having a plurality of apertures therein, the apertures of the top layer and the bottom layer alternating in a first direction, and alternating in a second direction substantially perpendicular to the first direction; and
      a pair of metal traces between the top and the bottom layers, the traces running generally in the first direction.

21. The integrated circuit package of claim 20, wherein the traces fan out at a first angle to the first direction.

22. The integrated circuit package of claim 21, wherein the first angle is plus or minus 45 degrees.

23. The integrated circuit package of claim 20, wherein the apertures are degassing holes.

24. The integrated circuit package of claim 20, wherein the apertures of the top layer and the bottom layer are arranged in a lattice formation.

25. The integrated circuit package of claim 20, wherein the spacing between adjacent apertures in the routing direction is twice the spacing between adjacent apertures in the second, substantially perpendicular direction.

26. The integrated circuit package of claim 20, wherein the spacing between apertures in the top layer is 1000 microns in the first direction, and wherein the spacing between apertures in the bottom layer is 1000 microns in the first direction.

27. The integrated circuit package of claim 20, wherein the spacing between apertures in the top layer is 500 microns in the second direction, and wherein the spacing between apertures in the bottom layer is 500 microns in the second direction.

28. The integrated circuit package of claim 20, wherein the spacing between apertures of the top layer and the bottom layer in the first direction is 500 microns.

29. The integrated circuit package of claim 20, wherein the spacing between apertures of the top and the bottom layer in the second direction is 250 microns.

30. A circuit assembly, comprising:

a microprocessor;

a substrate, comprising:

a first layer and a second layer stacked substantially on top of one another, and having a third layer sandwiched therebetween, each of the first and second layers having a plurality of apertures therein, the aperture positions in the first layer and in the second layer alternating in a first direction, and alternating in a second direction substantially perpendicular to the first direction; and a pair of metal traces between the first and the second layers, the traces running generally in the first direction; and a motherboard having a plurality of mounting areas thereon, the substrate mountable on the motherboard.

* * * * *